United States Patent
Rosi et al.

(10) Patent No.: US 7,591,969 B2
(45) Date of Patent: Sep. 22, 2009

(54) METHOD FOR MAKING A SUPPORTING BODY FOR THE LOCK OF A MOTOR VEHICLE, AND A SUPPORTING BODY THUS OBTAINED

(75) Inventors: Tommaso Rosi, Pisa (IT); Claudio Michetti, Capezzano Pianore (IT)

(73) Assignee: Intier Automotive Closures S.p.A., Cascine Vica Rivol (IT)

( * ) Notice: Subject to any disclaimer, the term of this patent is extended or adjusted under 35 U.S.C. 154(b) by 941 days.

(21) Appl. No.: 10/975,868

(22) Filed: Oct. 28, 2004

(65) Prior Publication Data

US 2005/0086985 A1 Apr. 28, 2005

(51) Int. Cl.
*B29C 45/14* (2006.01)

(52) U.S. Cl. .................. 264/250; 264/275; 264/238; 264/272.15; 264/272.17

(58) Field of Classification Search .......... None
See application file for complete search history.

(56) References Cited

U.S. PATENT DOCUMENTS

| | | | | |
|---|---|---|---|---|
| 3,678,577 A | * | 7/1972 | Weglin et al. ............. | 29/848 |
| 4,821,413 A | * | 4/1989 | Schmitt et al. ............. | 29/883 |
| 6,076,258 A | * | 6/2000 | Abe ............................ | 29/883 |
| 6,249,042 B1 | * | 6/2001 | Sato et al. .................. | 257/666 |
| 6,837,746 B2 | * | 1/2005 | Okamoto ................... | 439/606 |
| 2005/0121829 A1 | * | 6/2005 | Spurr et al. ............ | 264/272.11 |

FOREIGN PATENT DOCUMENTS

| EP | 0510843 | * | 4/1992 |
|---|---|---|---|
| EP | 2002-347065 | * | 12/2002 |

* cited by examiner

*Primary Examiner*—Edmund H. Lee
(74) *Attorney, Agent, or Firm*—Clark Hill PLC

(57) ABSTRACT

A method for making a supporting body (1) for the lock of a motor vehicle, including the steps of: forming an intermediate element (8) made of electrically insulating material provided with conductive paths (3); setting the intermediate element (8) inside a mold (23) for forming the supporting body (1); and injecting electrically insulating material in the mold (23) for carrying out co-molding of the supporting body (1). The intermediate element (8) and the conductive paths (3) are made independently, and the conductive paths (3) are fixed on opposite faces (9, 10) of the intermediate element (8) by constraint means (15, 16) of a mechanical type.

8 Claims, 4 Drawing Sheets

METHOD FOR MAKING A SUPPORTING BODY FOR THE LOCK OF A MOTOR VEHICLE, AND A SUPPORTING BODY THUS OBTAINED

BACKGROUND OF THE INVENTION

1. Field of the Invention

The present invention relates to a method for making a supporting body for the lock of a motor vehicle and to the supporting body obtained by means of the method.

2. Description of the Related Art

As is known, a closing system for a door of a motor vehicle basically comprises a lock and a striker mounted, respectively, on the door and on a fixed portion of the bodywork in the proximity of the compartment of the door itself (or, more rarely, vice versa).

The lock basically comprises a closing mechanism designed to be coupled in a releasable way with the striker to obtain a relative blocking between the lock and the striker itself when the door is closed, and a control assembly interacting with the closing mechanism and designed to provide a set of functions, such as, for example, mechanical opening and/or electrical opening and/or remote opening with user identification (passive-entry system), electrical closing, disabling/enabling of the opening of the door from the outside and/or from the inside of the motor vehicle (external-safety and internal-safety or dead-lock functions), and centralized control of the safety functions for all the locks of the motor vehicle via key or remote control.

In order to obtain the functions mentioned above, the control assembly comprises: a plurality of levers, at least one of which interacts with the closing mechanism; a plurality of electric motors for the control of the aforesaid levers via corresponding mechanical transmissions; a plurality of microswitches for detecting the position of various mobile elements; and an electrical circuit, which connects the microswitches and the electric motors with an electrical connector, which, in turn, can be connected to the electrical wiring system of the motor vehicle.

The various components constituting the control assembly are generally housed in a single supporting body which can be rigidly fixed to the door of the motor vehicle and is usually constituted by a shaped casing having a thickness smaller than the other dimensions.

The electrical circuit is formed by a plurality of conductive paths usually obtained by blanking and bending of a strip of metal material, normally copper or brass. In particular, the paths are formed initially in a single body, i.e., joined to one another via connecting portions or links, and are rendered independent at the moment of fixing of the lock to the supporting body by means of blanking of the aforesaid connecting portions.

The known modalities of fixing of the lock to the supporting body are basically two.

According to a first possibility, the conductive paths are englobed in a flexible element in the form of a foil (commonly referred to in the sector as "flexfoil") made of insulating material, generally plastic material, and fixed to the supporting body in a mechanical way, for example, via riveting.

Alternatively, the conductive paths can be co-molded to the supporting body of the lock. This modality of assembly calls for the execution of a series of operations.

In particular, the conductive paths, connected to one another to form a single body, are positioned inside a mold; next, via injection of plastic material, co-molding of an intermediate element of pre-set conformation is carried out.

At this point, the blanking operation of the connecting portions of the conductive paths is carried out directly on the intermediate element, which is then positioned inside a further mold for co-molding of the supporting body of the lock.

In both cases, it is not possible to obtain a supporting body in which the conductive paths are arranged on a number of layers set on top of one another. In fact, in the case where the conductive paths are carried by the flexible element, the foil conformation of the latter, having an infinitesimal thickness, in itself prevents the possibility of generating layers of conductive paths set on top of one another.

In the other case, the supporting and positioning close together of a number of layers of conductive paths inside the mold in which the injection of the plastic material is performed proves to be practically unrealizable, on account of the small thickness of the body that is formed.

The impossibility of obtaining multilayer conductive paths within the supporting body of the lock can become a markedly penalizing limit above all as the number of functions performed by the lock itself, and, consequently, the total number of paths necessary, increases. The use of single-layer paths cannot but entail a high encumbrance and complexity of the electrical control circuit, with obvious negative repercussions on the extension of the supporting body that is designed to house the circuit.

The purpose of the present invention is to provide a method for making a supporting body for the lock of a motor vehicle which will enable, in a simple and economically advantageous way, the drawbacks related to the known methods and specified above to be overcome.

SUMMARY OF THE INVENTION

The aforesaid purpose is achieved by the present invention, in so far as it relates to a method for making a supporting body for the lock of a motor vehicle, comprising the steps of:

forming an intermediate element made of electrically insulating material provided with conductive paths;

setting the intermediate element provided with conductive paths within a mold to form the supporting body; and injecting electrically insulating material in the mold for carrying out co-molding of the supporting body;

the method being characterized in that the intermediate element and the conductive paths are obtained independently, and in that the conductive paths are fixed to the intermediate element by constraint means of a mechanical type.

BRIEF DESCRIPTION OF THE DRAWINGS

For a better understanding of the present invention, there is now described a preferred embodiment, purely by way of non-limiting example, with reference to the attached drawings, in which.

DETAILED DESCRIPTION OF THE INVENTION

Figure 1:
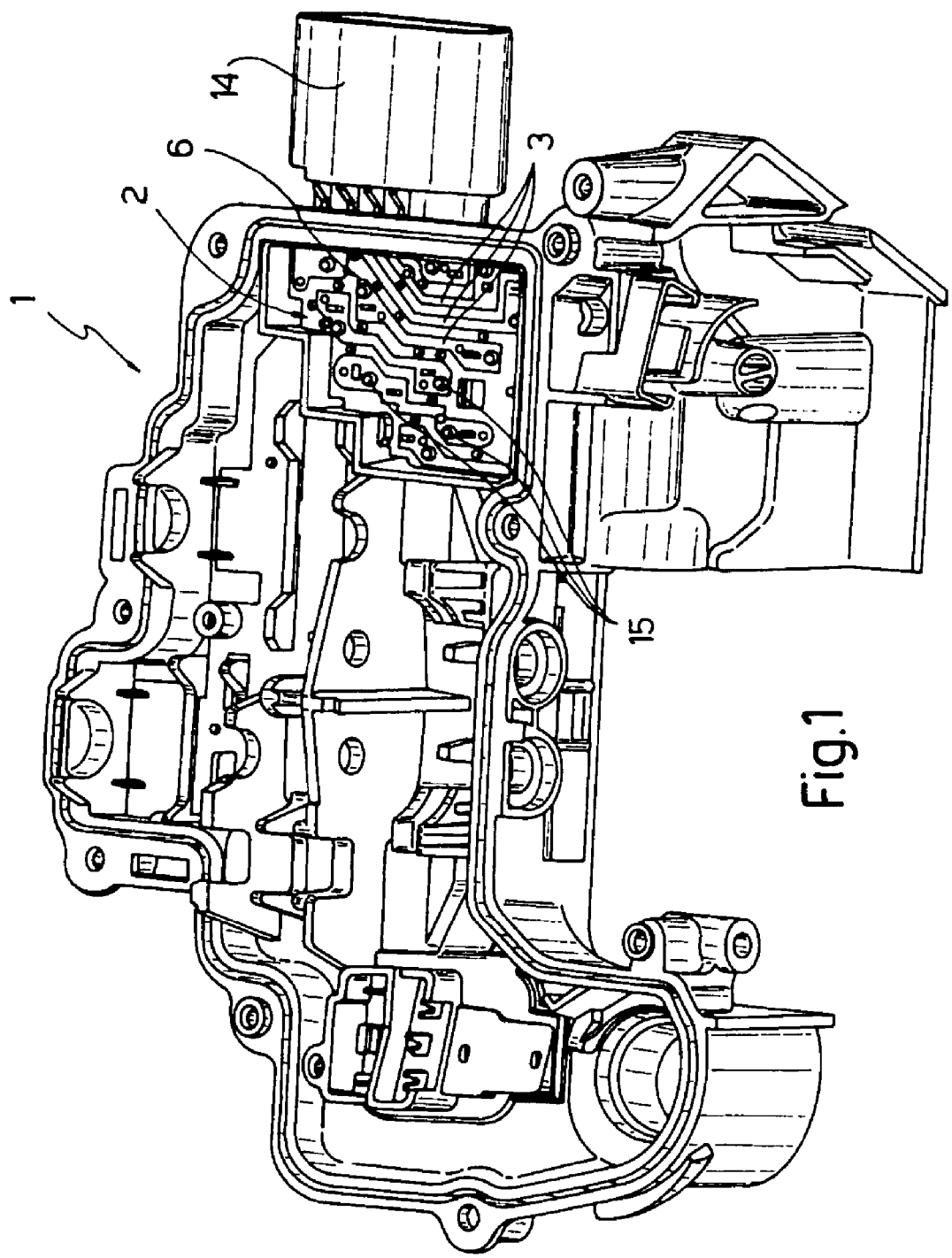
FIG. 1 is a perspective view of a supporting body for the lock of a motor vehicle, made according to the method forming the subject of the present invention.

With reference to FIG. 1, designated, as a whole, by 1 is a supporting body for the lock of a motor vehicle (in itself known and not illustrated).

The supporting body 1 is constituted by a plate element made of plastic material having a thickness smaller than the other dimensions and designed to support and house, in a way known and not illustrated, a plurality of mechanical members, for example levers, one or more electric motors of actuating the aforesaid mechanical members, and a plurality of detection members of an electromechanical type, for example microswitches.

The supporting body 1 houses, moreover, an electrical circuit 2 for connection of the aforesaid detection members and motors to an electrical connector 14, which can be connected, in turn, in a way known and not illustrated, to the electrical wiring system of the motor vehicle and which has an external casing made of a single piece with the supporting body 1 itself.

The circuit 2 is formed by a plurality of conductive paths 3, which, in use, are independent of one another.

According to an important characteristic of the present invention, the conductive paths 3 are co-molded with the supporting body 1 using the method described hereinafter and are arranged according to a plurality of layers set on top of one another, in the case in point three, designated respectively by the reference numbers 4, 5 and 6.

In particular, each layer 4, 5, 6 of conductive paths 3 is made of a single body in a conventional way by means of operations of blanking and bending conducted on a strip of metal material in the form of a plate, generally copper or brass.

Figure 2:
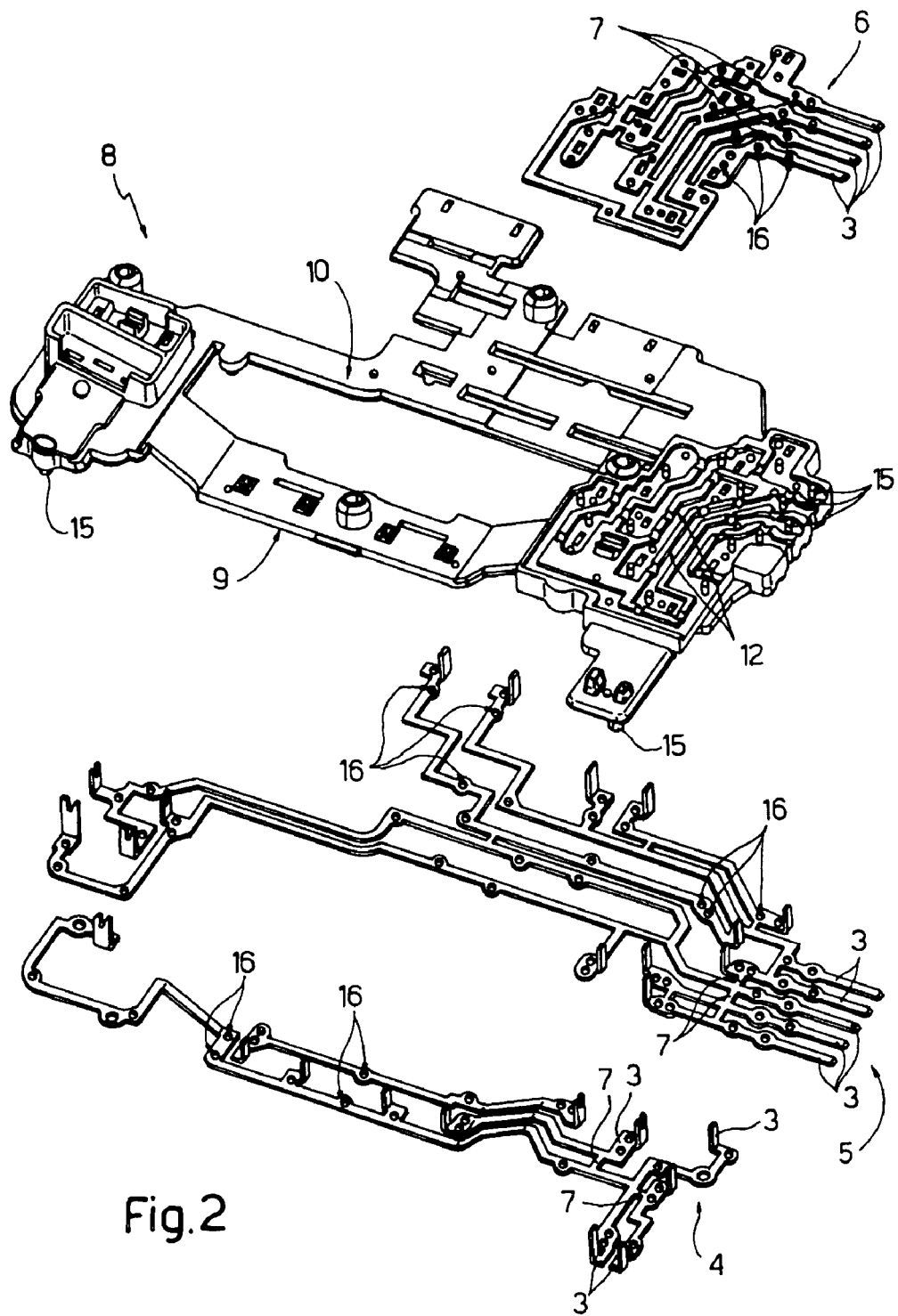
FIG. 2 is an exploded perspective view of an intermediate element obtained in the course of the method forming the subject of the present invention.

At the end of above operations, the conductive paths 3 of each layer 4, 5, 6 are joined together by connecting portions 7 (FIG. 2), designed to be subsequently removed to enable correct operation of the electrical circuit 2.

Figure 3:
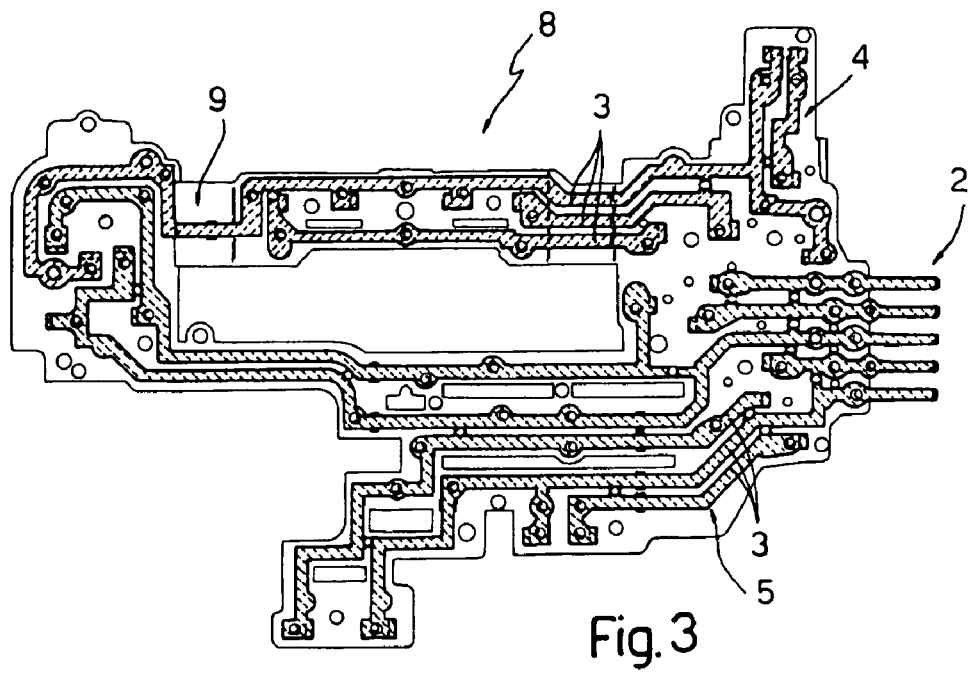
FIG. 3 is a view from beneath the intermediate element of FIG. 2.
Figure 4:
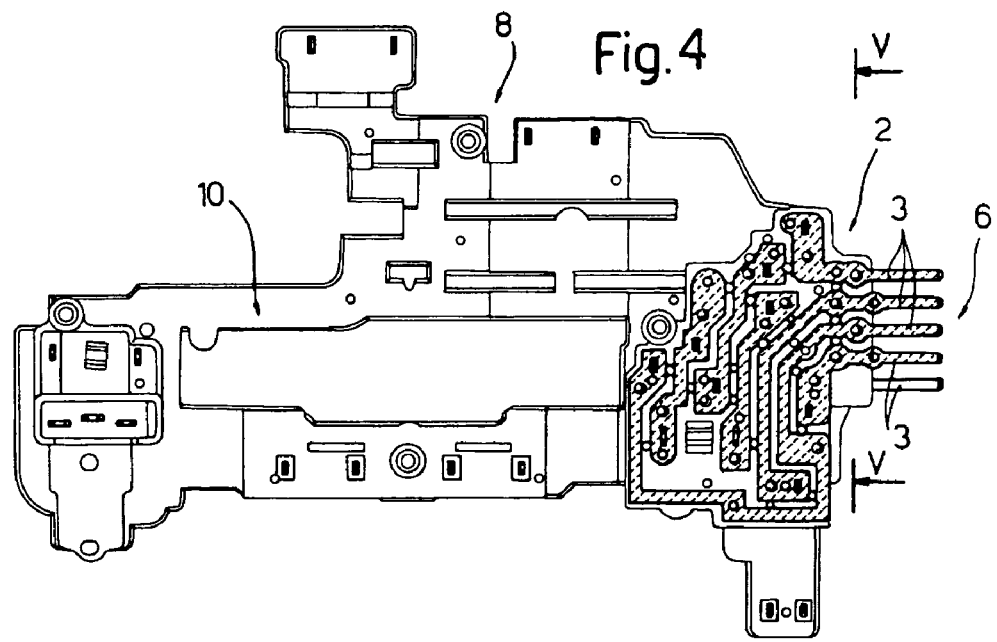
FIG. 4 is a view from above the intermediate element of FIG. 2.
Figure 6:
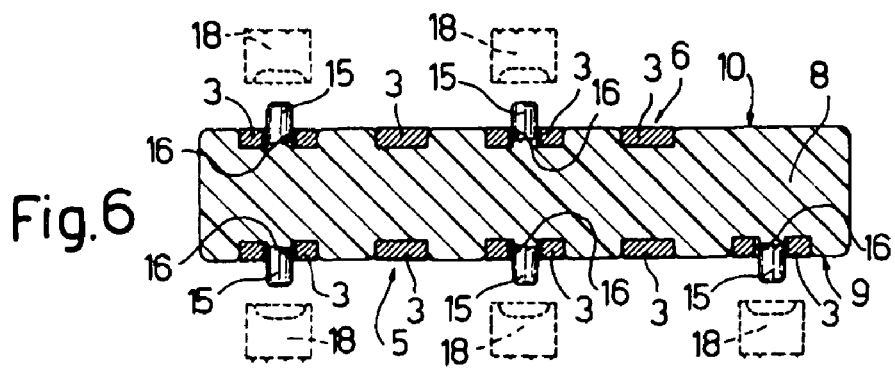
FIG. 6 is a cross-sectional view similar to that of FIG. 5 representing the intermediate element in the assembly step.
Figure 5:
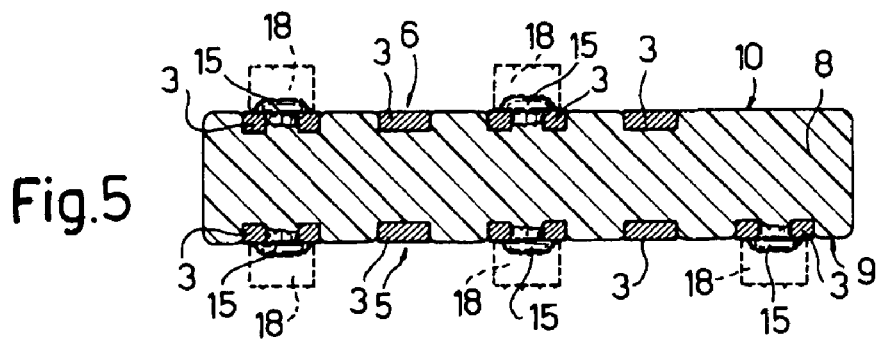
FIG. 5 is a cross-sectional view according to the line V-V of FIG. 4.

Simultaneously, and in a way independent of the conductive paths 3, an intermediate element 8 made of insulating material, preferably plastic material, is obtained by molding. As may be seen in FIGS. 2 to 4, the intermediate element 8 has a plate conformation and is provided, on opposite faces 9, 10 of its own, of respective pluralities of seats 11, 12 for receiving the conductive paths 3.

The intermediate element 8 is further provided with a plurality of pins 15 (FIGS. 2 to 6) projecting in cantilever fashion from the faces 9, 10 and designed to engage respective through holes 16 having a complementary shape, made on the conductive paths 3.

Fixing of the layers 4, 5 and 6 of conductive paths 3 on the intermediate element 8 is performed on both of the opposed faces 9, 10 of the intermediate element 8 itself.

More precisely, according to a preferred embodiment of the present invention, each layer 4, 5, 6 of conductive paths 3, joined together by the connecting portions 7, is brought close to the corresponding face 9, 10 of the intermediate element 8, by coupling the pins 15 with the respective holes 16.

At this point (see FIGS. 5 and 6), by means of thrust members 18 of a type known and illustrated only schematically, the pins 15 are cold pressed to the corresponding face 9, 10 of the intermediate element 8 so as to obtain the riveting of the conductive paths 3 on the intermediate element 8 itself.

The connecting portions 7 that join the conductive paths 3 of each layer 4, 5, 6 are then removed by means of a blanking operation by arranging the intermediate element 8 provided with the paths 3 themselves inside a purposely provided mold (in itself known and not illustrated).

Alternatively, the conductive paths 3 of each layer 4, 5, 6 could be separated from one another, for example manually, prior to their fixing on the intermediate element 8.

In the case in point illustrated, the layers 4 and 5 of conductive paths are fixed to the face 9 of the intermediate element 8, whilst the layer 6 is fixed to the opposite face 10.

Figure 7:
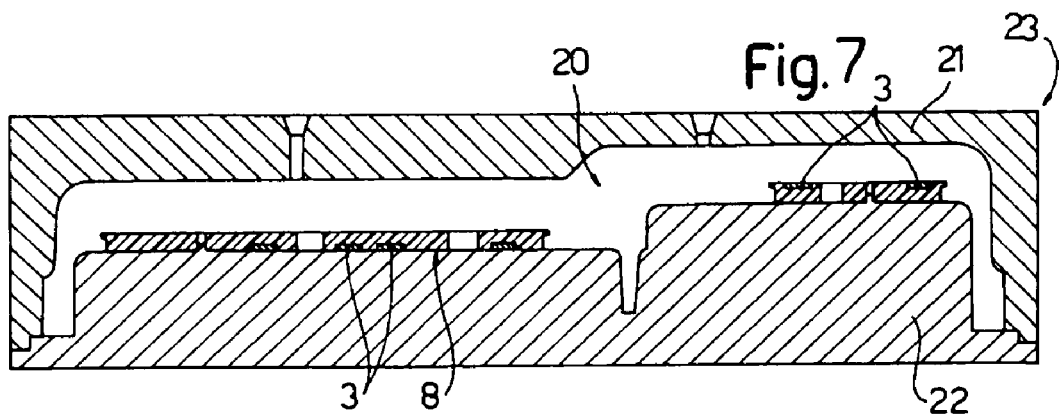
FIGS. 7 and 8 are cross-sectional views of the intermediate element of FIG. 2 and of the supporting body of FIG. 1 during distinct steps of the method forming the subject of the invention.
Figure 8:
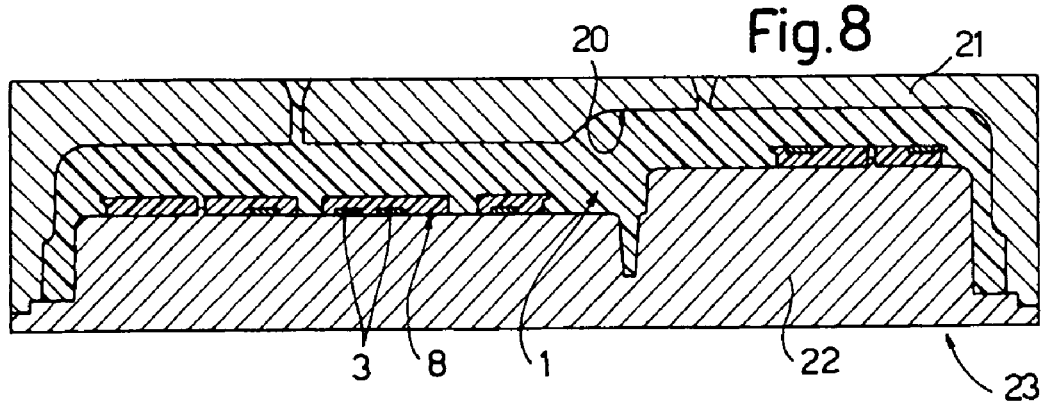

The intermediate element 8, which is provided with the conductive paths 3, is, at this point, introduced within a cavity 20 formed between two half-elements 21, 22 of a mold 23 for carrying out an operation of co-molding of the supporting body 1 (FIGS. 7 and 8).

Via injection of plastic material within the cavity 20, forming of the supporting body 1 is carried out, within which there remain embedded the intermediate element 8 and the conductive paths 3 arranged according to three layers 4, 5, 6 set on top of one another.

From an examination of the characteristics of the method and the supporting body 1 according to the present invention, the advantages that it enables are evident.

In particular, the method previously described enables fabrication of a supporting body 1 for a lock incorporating inside it, within the limits imposed by its own reduced thickness, a plurality of conductive paths 3 arranged according to layers 4, 5, 6 set on top of one another.

The supporting body 1 thus obtained proves particularly suited for housing locks that implement a large number of electrical functions, without any substantial negative repercussions on its own overall dimensions.

Finally, it is clear that modifications and variations may be made to the method and the supporting body 1 described and illustrated herein without thereby departing from the scope of protection of the present invention.

The invention claimed is:

1. A method for making a supporting body (1) for the lock of a motor vehicle, comprising the steps of:
    forming an intermediate element (8) made of insulating material provided with conductive paths (3);
    setting said intermediate element (8) equipped with conductive paths (3) within a mold (23) for forming said supporting body (1); and
    injecting fluid material into said mold (23) for carrying out co-molding of said supporting body (1);
said method being characterized in that said intermediate element (8) and said conductive paths (3) are made independently, and in that said conductive paths (3) are fixed to said intermediate element (8) by constraint means (15, 16) of a mechanical type.

2. The method according to claim 1, characterized in that said intermediate element (8) is obtained by molding and is provided with seats (11, 12) for receiving said conductive paths (3).

3. The method according to claim 2, characterized in that said constraint means of a mechanical type comprise a plurality of first engagement elements (15) carried by said intermediate element (8), which can be coupled to second engagement elements (16) carried by said conductive paths (3).

4. The method according to claim 3, characterized in that said first and second engagement elements comprise pins (15) and holes (16) that are complementary to one another.

5. The method according to claim 4, characterized in that said conductive paths (3) are fixed to said intermediate element (8) according to layers (4, 5, 6) set on top of one another.

6. The method according to claim 5, characterized in that at least two (4, 5; 6) of said layers of conductive paths (3) are fixed to respective opposite faces (9, 10) of said intermediate element (8).

7. The method according to claim 6, characterized in that said conductive paths (3) of each layer (4, 5, 6) are joined together by connecting portions (7) so as to form a single body, and in that said connecting portions (7) are subjected to a blanking operation subsequently to fixing of said layers (4, 5, 6) of conductive paths (3) to said intermediate element (8).

8. The method according to claim 6, characterized in that said conductive paths (3) of each layer (4, 5, 6) are joined together by connecting portions (7) so as to form a single body, and in that said connecting portions (7) are removed prior to fixing of said layers (4, 5, 6) of conductive paths (3) to said intermediate element (8).

* * * * *